United States Patent [19]

Zaderej et al.

[11] Patent Number: 5,156,552
[45] Date of Patent: Oct. 20, 1992

[54] CIRCUIT BOARD EDGE CONNECTOR

[75] Inventors: Victor V. Zaderej, North Haven; James E. Betters, Madison, both of Conn.

[73] Assignee: General Electric Company, Coshocton, Ohio

[21] Appl. No.: 484,421

[22] Filed: Feb. 23, 1990

[51] Int. Cl.[5] ............................................. H01R 9/09
[52] U.S. Cl. ..................................... 439/59; 439/630; 439/637; 439/78
[58] Field of Search .................... 439/59, 62, 78, 86, 439/629, 630, 632, 636, 637, 876, 931

[56] References Cited

U.S. PATENT DOCUMENTS

| | | | |
|---|---|---|---|
| 3,529,082 | 9/1970 | Hoesli | 178/6.5 |
| 3,646,504 | 2/1972 | Classon | 439/637 |
| 4,029,006 | 6/1977 | Mercer | 101/35 |
| 4,120,330 | 10/1978 | Weismann | 140/112 |
| 4,233,754 | 11/1980 | Dubuit | 34/203 |
| 4,414,298 | 11/1983 | Krenz | 429/99 |
| 4,584,767 | 4/1986 | Gregory | 29/848 |
| 4,591,220 | 5/1986 | Impey | 339/17 M |
| 4,645,347 | 2/1987 | Rioux | 356/376 |
| 4,689,103 | 8/1987 | Elarde | 156/242 |
| 4,692,878 | 9/1987 | Ciongoli | 364/518 |
| 4,710,419 | 12/1987 | Gregory | 428/210 |
| 4,749,355 | 6/1988 | Hemmer | 439/63 |
| 4,764,849 | 8/1988 | Khan | 361/428 |
| 4,791,490 | 12/1988 | Knight et al. | 358/209 |
| 4,921,453 | 5/1990 | O'Brien | 439/630 |

OTHER PUBLICATIONS

IPC-MB-380 Draft Standard, Performance Specifications for Molded Printed Boards, Jan. 1987.
"Electrophoretic Photoresist Technology: An Image of the Future—Tody", Vidusek, EPIC Winter Conference, Dec. 1988.
"Cast Spring"—A Plated, Molded Thermoplastic Electrical I/O Interface Jack O'Brien, Connection Technology, Jun. 1989.
MINT-PAC Technologies Inc., "SOlutions to Tomorrows Electronic Packaging Needs", Summer 1989 promotional literature.

Primary Examiner—Paula A. Bradley
Attorney, Agent, or Firm—Gary L. Loser

[57] ABSTRACT

A molded plastic circuit card edge connector. The connector includes two opposing rows of cantilever contact arms. The rows of contact arms are spaced apart adequately to allow insertion of a circuit board between the arms. The contact arms flex outward to provide spring pressure toward the circuit board. The contact arms include a main contact area which is dimensioned to produce a tapered entrance for receiving a circuit board. A plurality of stop ribs prevent the circuit board from going in too far while a pair of U-shaped guides serve to properly register the circuit board and guide it into place. The connector may be molded as an integral part of a printed wiring board.

16 Claims, 1 Drawing Sheet

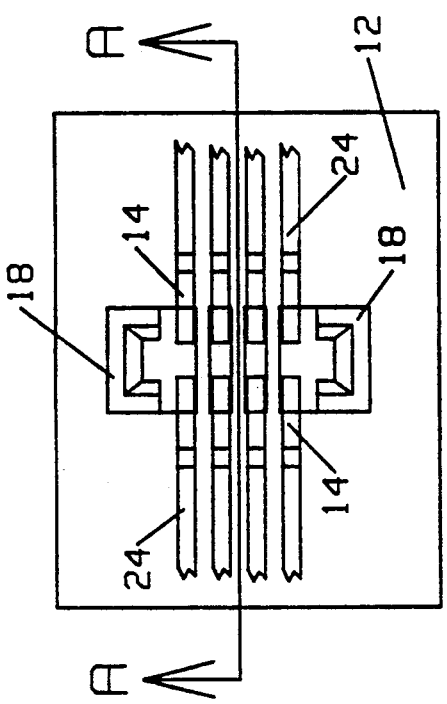
FIG. 2
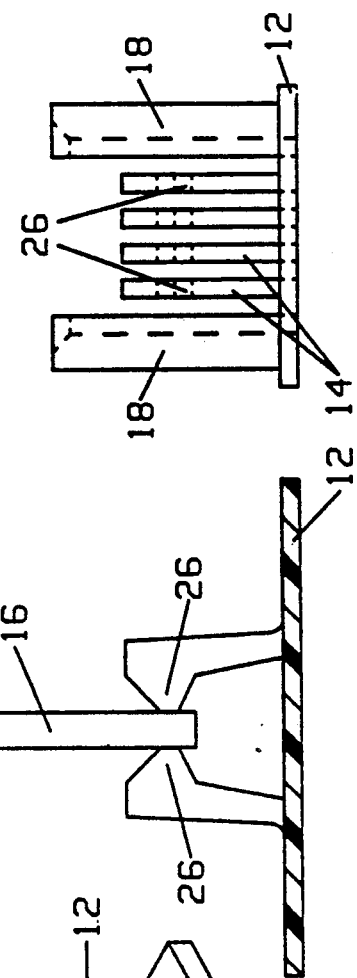
FIG. 3
FIG. 4
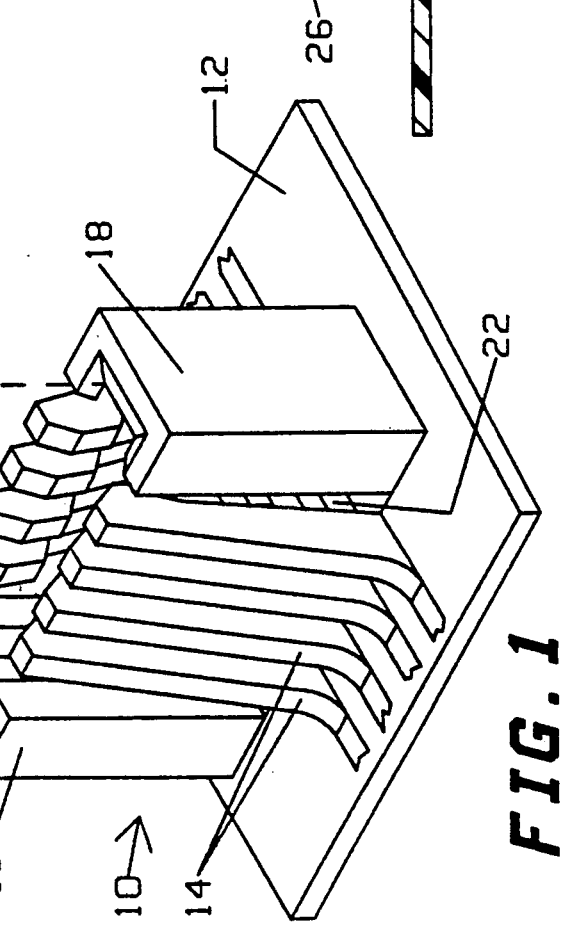
FIG. 1

CIRCUIT BOARD EDGE CONNECTOR

CROSS REFERENCE TO RELATED APPLICATIONS

This application is related to the following patent applications filed simultaneously herewith which are incorporated herein by reference: "Plated Electrical Connectors", to Victor Zaderej et al., Ser. No. 484,579, now abandoned; "Three Dimensional Plating Or Etching Process And Masks Therefor", to John Mettler et al., Ser. No. 484,387 now U.S. Pat. No. 4,985,116; "Plated D-Shell Connector", to Victor Zaderej et al., Ser. No. 484,391; and "Audio Jack Connector", to Victor Zaderej et al., Ser. No. 484,229, now abandoned.

BACKGROUND

1. Field of the Invention

This invention relates generally to the field of electrical connectors. More particularly, this invention relates to a circuit board edge connector fabricated by molding and plating or etching metalization patterns on the plastic.

2. Background of the Invention

Circuit card edge connectors are widely used throughout the electronics industry to mate various circuit cards together for various reasons. For example, such connectors are frequently wired together in large card cages in communications equipment such as telephone office equipment. They are similarly used in computer equipment in large and small racks. In personal computers and other devices, such connectors are used to mate together mother and daughter boards. For example, in personal computers such connectors may be used to couple modems, memory cards, disk drive controllers and the like to the main computer mother board.

Currently available circuit card edge connectors are somewhat costly devices which contain relatively large numbers of metal and plastic parts and which are soldered to a circuit board. The present invention provides an integral circuit card edge connector which may be fabricated as a part of a printed wiring board (PWB) eliminating secondary operations required for installation.

SUMMARY OF THE INVENTION

It is an object of the present invention to provide an improved molded circuit board edge connector.

It is another object of the present invention to provide such a circuit board edge connector which may be fabricated as a portion of a printed wiring board using three dimensional plating or etching techniques.

It is an advantage of the invention that fewer components must be inserted and soldered into a circuit board to enable mating with a circuit card edge.

It is another advantage that circuit card edge connectors of any configuration and number of contacts may be fabricated using the present invention without significant cost penalties.

These and other objects and advantages of the invention will become apparent to those skilled in the art upon consideration of the following description of the invention.

A molded circuit card edge connector according to the present invention includes an electrically insulative substrate. A first row of contact arms is molded as an integral part of the insulative substrate and extend upward from the substrate. The contact arms include a base adjacent the insulative substrate and a first contact surface. A second row of contact arms are molded as an integral part of the insulative substrate and extend upward from the substrate, the contact arms include a base adjacent the insulative substrate and a second contact surface. An electrically conductive material is plated to the first and second contact surfaces of the first and second contact arms, to conductively connect the contact surface to the insulative substrate. The first and second rows of contact arms are spaced apart by a predetermined distance with the contact surfaces facing opposite directions, to accept a circuit card between the first and second rows of contact arms in a manner such that the contact surfaces contact the circuit card.

A molded circuit card edge connector according to the preferred embodiment includes an insulative substrate forming a part of a printed wiring board. A first row of contact arms are molded as an integral part of the insulative substrate and extend upward at an angle approximately seven degrees from perpendicular with the substrate. The contact arms include a base adjacent the insulative substrate a first contact surface. A second row of contact arms is also molded as an integral part of the insulative substrate and extend upward at an angle approximately seven degrees from perpendicular with the substrate These contact arms also include a base adjacent the insulative substrate and a second contact surface. Each row of contact arms includes two ends and further includes a guide situated at each end for guiding the circuit card into position between the rows of contact arms. The guide includes a column having an approximately U-shaped channel for accepting the circuit card. An electrical conductor is plated to the first and second contact surfaces of the first and second contact arms, and lead to the insulative substrate. The first and second rows of contact arms are spaced apart by a predetermined distance which is less than a thickness of a circuit card, with the contact surfaces facing opposite directions, to accept the circuit card between the first and second rows of contact arms in a manner such that the contact surfaces contact the circuit card and cause the contact arms to flex away from each other and to hold the circuit card. The contact surfaces taper toward each other so that the circuit card encounters a tapered space between the first and second rows when inserted between the rows. A stop prevents the circuit card from traveling too far when inserted between the rows of contact arms.

The present invention generally relates to a molded plastic circuit card edge connector. The connector of the preferred embodiment includes two opposing rows of cantilever contact arms. The rows of contact arms are spaced apart adequately to allow insertion of a circuit board between the arms. The contact arms flex outward to provide spring pressure toward the circuit board. The contact arms include a main contact area which is dimensioned to produce a tapered entrance for receiving a circuit board. A plurality of stop ribs prevent the circuit board from going in too far while a pair of U-shaped guides serve to properly register the circuit board and guide it into place. The connector may be molded as an integral part of a printed wiring board.

The features of the invention believed to be novel are set forth with particularity in the appended claims. The invention itself, however, both as to organization and method of operation, together with further objects and advantages thereof, may be best understood by refer-

BRIEF DESCRIPTION OF THE DRAWING

FIG. 1 shows a perspective view of the circuit card edge connector of the preferred embodiment.

FIG. 2 shows a top view of the edge connector of the present invention.

FIG. 3 shows a side view of the edge connector of the present invention.

FIG. 4 shows a sectional view of the connector of the present invention with the cross section taken along lines A—A of FIG. 2 showing a daughter board partially inserted in the connector.

DETAILED DESCRIPTION OF THE INVENTION

Turning now to the several figures of the drawing in which like reference numerals designate corresponding parts throughout the several figures thereof, and in particular to FIG. 1, a circuit card edge connector according to the present invention is shown. This connector 10 is fabricated as a part of a printed wiring board (PWB) 12. The connector 10 includes eight cantilevered contact arms or contacts 14 fabricated as two rows of four such contacts. Of course, this is not to be limiting since any desired number of such contacts may be provided, with fifty or eighty such contacts being commonly used in conventional edge connectors. Each contact arm 14 acts as a spring using the resilient spring properties of the plastic material from which the connector 10 and PWB 12 are molded. In the preferred embodiment, the material used to mold the connector is General Electric Ultem 2312 Polyetherimide, but other materials may also be suitable.

In the preferred embodiment, each row of contacts 14 contains the same number of contacts 14 with each such contact 14 being situated in diametric opposition with another contact on the opposite row. Of course, this is not to be limiting since each connector 10 may be custom designed to fit the individual needs of the particular environment of use. In general, if the connector 10 is fabricated as shown as a part of a printed wiring board 12. Since PWB's 12 must, in general, be custom designed anyway, making custom connector configurations adds little if any additional cost to the overall structure. Accordingly, staggered contact configurations, missing or irregularly spaced contact arms 14 and other variations may be readily accommodated as needed or desired without the cost associated with manufacturing separate custom connectors.

The circuit card edge connector 10 also includes a pair of guides 18 situated at each end of the two rows of contacts 14. These guides 18 serve to align a mating daughter board 16 or other circuit card between the two rows of contacts 14 so that the contacts 14 each contact an appropriate pad 17 on the daughter board. In the preferred embodiment, these guides have an approximately U-shaped cross section so that the mating daughter board 16 is registered within a U-shaped channel formed by the U-shape of the guides 18. At the upper end of the U-shaped channel, the inside corners may be chamfered or otherwise tapered as shown in FIG. 2 and FIG. 3. This facilitates insertion of the daughter board 16 by guiding the daughter board into proper registration with the space formed between the two rows of contact arms.

The channel is preferably slightly wider than the maximum thickness of the daughter board 16 to ensure it will always properly receive the daughter board. Of course, this is not to be limiting, but has the advantage of assisting in guiding the daughter board 16 into proper place and helps prevent transfer of undue stress to the contacts 14 in the event the daughter board 16 is bent or pulled in one direction or the other. Guides 18 are preferably a bit taller than the contacts 14. In the preferred embodiment, they are approximately 0.50 inches tall.

The circuit card edge connector 10 also preferably includes a bottom stop 22 which may be fabricated in any number of configurations including a solid strip. In the preferred embodiment, it is fabricated as a plurality of individual plastic rungs or ribs 22 disposed between each of the contacts 14 in a ladder like arrangement joining each side of the circuit card 12 from which the connector 10 is molded. The bottom stop 22 serves several purposes. First, it allows the daughter board 16 to fully seat in the connector 10. Also, the stop permits connections to be made between contacts 14 on opposite sides of the daughter board or to facilitate transportation of PWB metal traces from one side of connector 10 to the other for whatever reason required by the circuit layout. Furthermore, such a rib configuration or similar serves to stiffen the circuit board 12 to help prevent it from flexing in the region of the connector 10 thus inhibiting intermittent connections.

The contacts 14 are plated with any of a plurality of conductive metals using a plating or etching process such as that disclosed in the above incorporated John Mettler et al. patent application in order to provide for maximum metal to metal contact compatibility. The plating may substantially cover the entire contact 14 from its base at the circuit board 12 to the top and completely encircling it. At the base of the contacts 14, each contact should be isolated from adjacent contacts 14 by a spacing in the plating as shown unless it is desired that adjacent contacts 14 should be electrically connected. The contacts may then be interconnected with various electrical components using plated PWB traces such as 24 as shown in FIG. 2. Such traces 24 are omitted from the other views for clarity.

A flexible or rigid mask may be used in plating the contact arms 14 and may allow plating to substantially cover the entire arm. Only the substrate area adjacent the bases of the contact arms need to be masked to produce electrical isolation between adjacent contact arms 14 as required. Due to the shape of the contact arms 14, a mask cannot tightly register over each arm at the lower inner surface. This is of no particular consequence since the entire arm 14 may be plated.

Turning now to FIG. 4, a sectional view along lines A—A of FIG. 2 is shown. In the preferred embodiment, the plastic spring formed by the contact arms 14 is designed to provide approximately 150 to 500 grams of normal contact force. Of course, this force is dependent upon the exact dimensions, tolerance and materials of the contacts 14 and may be accordingly designed for a wide range of forces. In the preferred embodiment, the contacts 14 are approximately 0.40 inches in total vertical height above the top surface of board 10. Each contact 14 includes a main contact area 26 which physically contacts the daughter board. This main contact area 26 is centered approximately 0.30 inches above the top surface of the board 10 and extends outward from the contact arm 14.

The main contact area 26 is tapered from the center of the main contact area 26 to the top of the contact 14 to provide a tapered entrance to the connector which facilitates guiding the daughter board into proper registration with the connector 10. The main contact areas 26 are also tapered downward for approximately 0.10 inches to the nominal dimension of the contact arm 14. Of course, this contact configuration may be varied substantially without departing from the present invention. The main contact area 26 may be rounded, flat, triangular, trapezoidal, etc. with similar results. The contact arm 14 itself may also be varied in angle, taper, length, width, thickness, etc. to achieve various forces and effects.

The contact arms are approximately 0.08 inches wide near the base adjacent the substrate (in the dimension shown in FIG. 4) and about 0.050 inches thick (in the dimension shown in FIG. 3). The spacing between adjacent contacts in the same row can be approximately 0.050 inches. The main contact area 26 is dimensioned to provide a nominal spacing between corresponding contacts of approximately 0.060 inches (without daughter board inserted) in order to accommodate daughter boards of nominal thickness of 0.062 inches. The contact arms 14 extend upward from the circuit board 10 at an angle of approximately seven degrees from perpendicular. All dimensions are within plus or minus approximately 0.005 inches in linear tolerance unless specified otherwise.

While the dimensions disclosed herein, are not intended to be limiting, they provide for a good mate with standard commercially available circuit cards having nominal thickness of 0.062. The dimensions disclosed are for the unplated plastic part and assume that a plating thickness of approximately 0.0015 inches will be deposited on the part as shown and / or described. The contact arms 14 are dimensioned so that the displacement of the contact arms 14 in use are limited to a deflection which will prevent significant stress on the preferred plastic material.

Of course, the embodiment shown is intended only to be illustrative. Many variations can be devised without departing from the present invention. In particular, although an eight contact connector is shown and described, the greatest utility of the present invention is probably with much larger connectors or connectors of custom configuration. Similarly, only a small PWB 12 is shown, but it will be understood by those skilled in the art that much larger PWB's which possibly include other three dimensional features and possibly multiple connectors are contemplated. In this manner, a mother board, such as those commonly used for personal computers, may be fabricated with integral expansion slots fabricated as a portion of the mother board. Similarly, backplane cards for circuit card cages can be fabricated without requiring separate edge connector part installation.

Thus it is apparent that in accordance with the present invention, an improved apparatus and method that fully satisfies the objectives, aims and advantages is set forth above. While the invention has been described in conjunction with specific embodiments, it is evident that many alternatives, variations, modifications and permutations will become apparent to those skilled in the art in light of the foregoing description. Accordingly, it is intended that the present invention embrace all such alternatives, variations, modifications and permutations as fall within the spirit and broad scope of the appended claims.

What is claimed as new and desired to be secured by Letters Patent is:

1. A molded circuit card edge connector, comprising in combination:
   an insulative substrate;
   first row of contact arms molded as an integral part of said insulative substrate and extending upward from said substrate, said contact arms including a base adjacent said insulative substrate and a first contact surface;
   a second row of contact arms molded as an integral part of said insulative substrate and extending upward from said substrate, said contact arms including a base adjacent said insulative substrate and a second contact surface;
   electrical conductor means, plated to said first and. second contact surfaces of said first and second contact arms, and leading to said insulative substrate;
   said first and second rows of contact arms being spaced apart by a predetermined distance with said contact surfaces facing opposite directions, to accept a circuit card between said first and second rows of contact arms in a manner such that said contact surfaces contact said circuit card.

2. The apparatus of claim 1, wherein said contact arms extend upward from said insulative substrate at an angle approximately seven degrees from perpendicular.

3. The apparatus of claim 1, wherein said insulative substrate comprises a printed wiring board.

4. The apparatus of claim 1, wherein said first row of contact arms include irregularly spaced contact arms.

5. The apparatus of claim 1, wherein said predetermined distance is less than a predetermined thickness, said predetermined thickness corresponding to a thickness of said circuit card, so that when said circuit card is inserted between said first and second rows of contact arms, said contact arms are caused to flex away from each other and hold said circuit card.

6. The apparatus of claim 5, wherein each of said contact arms flex by an amount which produces between approximately 150 and 500 grams of normal force on said circuit card.

7. The apparatus of claim 1, wherein each said row of contact arms includes two ends and further comprising guiding means situated at each said end for guiding said circuit card into position between said rows of contact arms.

8. The apparatus of claim 7, wherein said guiding means comprises column having an approximately U-shaped channel for accepting said circuit card.

9. The apparatus of claim 1, further comprising stopping means for preventing said circuit card from traveling too far when inserted between said rows of contact arms.

10. The apparatus of claim 9, wherein said stopping means comprises a plurality of ribs extending from said first row of contact arms to said second row of contact arms adjacent said bases thereof.

11. The apparatus of claim 1, wherein said first and second rows of contact arms include the same number of contact arms.

12. The apparatus of claim 11, wherein each contact arm in said first row is diametrically opposite a contact arm in said second row.

13. The apparatus of claim 12, wherein said first and second row of contact arms each include equally spaced contact arms.

14. The apparatus of claim 1, wherein said contact surfaces of said first and second rows extend outward from said contact arms toward each other.

15. The apparatus of claim 14, wherein said contact surfaces taper toward each other so that said circuit card encounters a tapered space between said first and second rows when inserted between said rows.

16. A molded circuit card edge connector, comprising in combination:

an insulative substrate forming a part of a printed wiring board;

first row of contact arms molded as an integral part of said insulative substrate and extending upward at an angle approximately seven degrees from perpendicular with said substrate, said contact arms including a base adjacent said insulative substrate a first contact surface;

a second row of contact arms molded as an integral part of said insulative substrate and extending upward at an angle approximately seven degrees from perpendicular with said substrate, said contact arms including a base adjacent said insulative substrate and a second contact surface;

each said row of contact arms includes two ends and further comprising guiding means situated at each said end for guiding said circuit card into position between said rows of contact arms, said guiding means comprising a column having an approximately U-shaped channel for accepting said circuit card;

electrical conductor means, plated to said first and second contact surfaces of said first and second contact arms, and leading to said insulative substrate;

said first and second rows of contact arms being spaced apart by a predetermined distance, which is less than a thickness of a circuit card, with said contact surfaces facing opposite directions, to accept said circuit card between said first and second rows of contact arms in a manner such that said contact surfaces contact said circuit card and cause said contact arms to flex away from each other hold said circuit card;

said contact surfaces taper toward each other so that said circuit card encounters a tapered space between said first and second rows when inserted between said rows; and stopping means for preventing said circuit card from traveling too far when inserted between said rows of contact arms.

* * * * *